United States Patent
Jiang et al.

(10) Patent No.: US 10,090,131 B2
(45) Date of Patent: Oct. 2, 2018

(54) METHOD AND SYSTEM FOR ABERRATION CORRECTION IN AN ELECTRON BEAM SYSTEM

(71) Applicant: KLA-Tencor Corporation, Milpitas, CA (US)

(72) Inventors: Xinrong Jiang, Palo Alto, CA (US); Christopher Sears, Fremont, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 15/371,557

(22) Filed: Dec. 7, 2016

(65) Prior Publication Data

US 2018/0158644 A1 Jun. 7, 2018

(51) Int. Cl.
*H01J 37/28* (2006.01)
*H01J 37/10* (2006.01)
*H01J 37/147* (2006.01)

(52) U.S. Cl.
CPC .......... *H01J 37/1474* (2013.01); *H01J 37/10* (2013.01); *H01J 37/28* (2013.01); *H01J 2237/1508* (2013.01); *H01J 2237/28* (2013.01)

(58) Field of Classification Search
CPC ....... H01J 37/153; H01J 37/141; H01J 37/222
USPC ............. 250/396 R, 310, 311, 396 ML, 306, 250/492.22, 492.23
See application file for complete search history.

(56) References Cited

U.S. PATENT DOCUMENTS

| | | | | |
|---|---|---|---|---|
| 4,411,519 A | * | 10/1983 | Tagami | G01J 5/60 356/406 |
| 4,710,639 A | * | 12/1987 | Sawaragi | H01J 37/3171 250/398 |
| 5,973,333 A | * | 10/1999 | Nakasuji | B82Y 10/00 250/398 |
| 6,452,175 B1 | * | 9/2002 | Adamec | H01J 37/1478 250/310 |
| 6,552,340 B1 | * | 4/2003 | Krivanek | H01J 37/153 250/305 |
| 6,580,073 B2 | * | 6/2003 | Plies | H01J 49/288 250/305 |
| 6,924,488 B2 | * | 8/2005 | Matsuya | H01J 37/153 250/311 |
| 7,381,951 B2 | * | 6/2008 | Doi | G21K 1/08 250/310 |

(Continued)

OTHER PUBLICATIONS

U.S. Appl. No. 15/267,223, filed Sep. 16, 2016, Doug K. Masnaghetti et al.

(Continued)

*Primary Examiner* — David A Vanore
(74) *Attorney, Agent, or Firm* — Suiter Swantz pc llo

(57) ABSTRACT

An electron-optical system for performing electron microscopy is disclosed. The system includes an electron beam source configured to generate a primary electron beam. The system includes a source lens, a condenser lens and an objective lens disposed along an optical axis. The system includes a first Wien filter disposed along the optical axis and a second Wien filter disposed along the optical axis. The first Wien filter and the second Wien filter are disposed between the source lens and the objective lens. The first Wien filter is configured to correct chromatic aberration in the primary beam. The system also includes a detector assembly configured to detect electrons emanating from the surface of the sample.

44 Claims, 12 Drawing Sheets

(56) References Cited

U.S. PATENT DOCUMENTS

| | | | | |
|---|---|---|---|---|
| 8,841,630 B2* | 9/2014 | Henstra | ............... | H01J 37/153 |
| | | | | 250/310 |
| 8,921,782 B2* | 12/2014 | Jiang | .................... | H01J 37/263 |
| | | | | 250/306 |
| 2003/0098415 A1* | 5/2003 | Matsuya | .............. | G01N 23/225 |
| | | | | 250/306 |
| 2003/0122076 A1* | 7/2003 | Matsuya | .............. | H01J 37/153 |
| | | | | 250/311 |
| 2008/0142723 A1 | 6/2008 | Goto | | |
| 2013/0270435 A1* | 10/2013 | Sohda | .................. | H01J 37/153 |
| | | | | 250/306 |
| 2015/0034836 A1 | 2/2015 | Sohda et al. | | |
| 2015/0076362 A1* | 3/2015 | Sohda | .................. | H01J 37/153 |
| | | | | 250/440.11 |
| 2015/0340200 A1 | 11/2015 | Jiang et al. | | |
| 2015/0364290 A1* | 12/2015 | Enyama | ............. | H01J 37/1478 |
| | | | | 250/396 ML |
| 2016/0217967 A1 | 7/2016 | Dohi et al. | | |
| 2016/0300690 A1* | 10/2016 | Ikegami | ............... | H01J 37/147 |
| 2016/0329189 A1* | 11/2016 | Sears | ...................... | H01J 37/28 |
| 2017/0084423 A1* | 3/2017 | Masnaghetti | ......... | H01J 37/222 |

OTHER PUBLICATIONS

International Search Report dated Apr. 13, 2018 for PCT/US2017/064958.

* cited by examiner

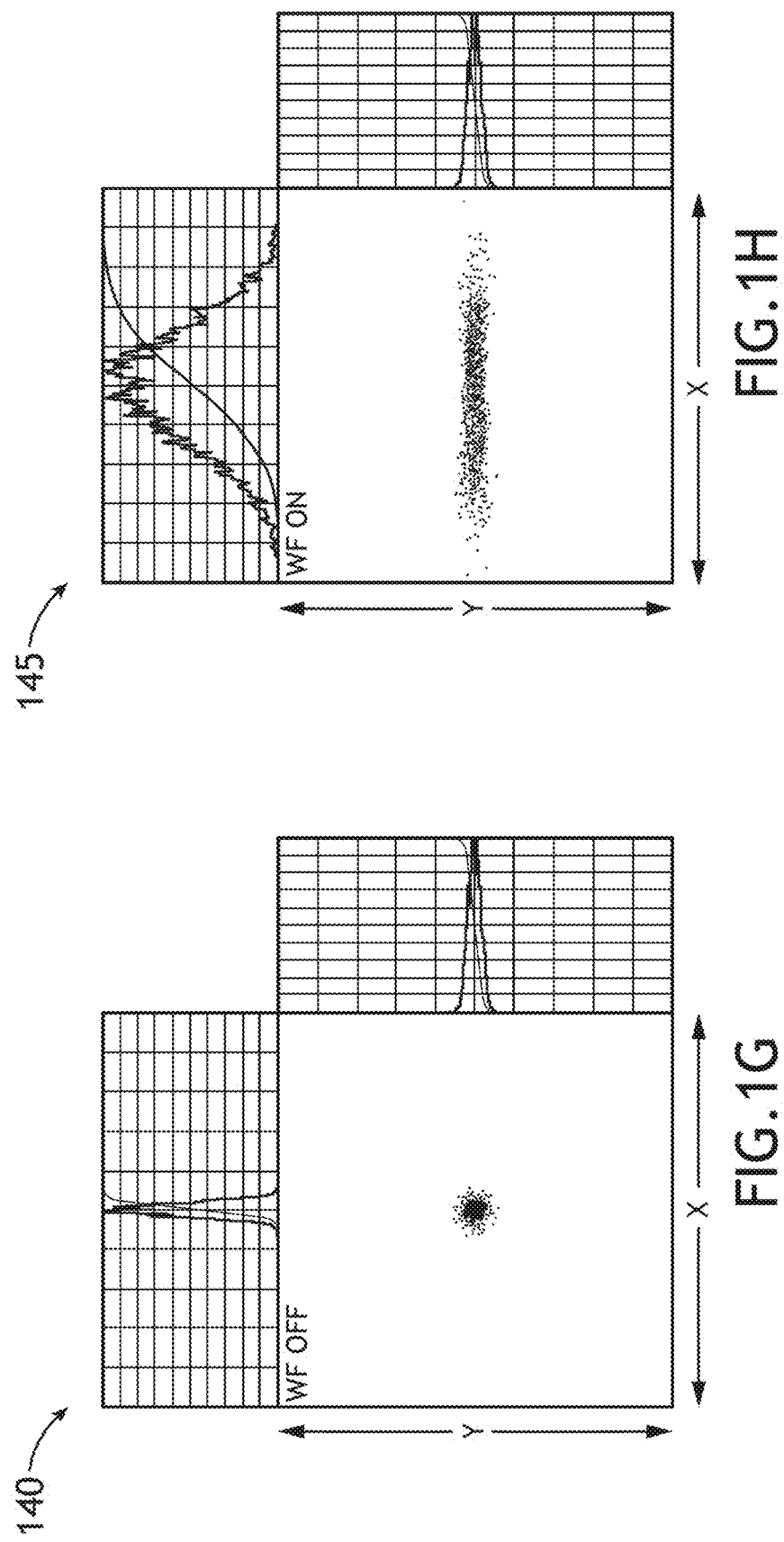

METHOD AND SYSTEM FOR ABERRATION CORRECTION IN AN ELECTRON BEAM SYSTEM

TECHNICAL FIELD

The present invention generally relates to scanning electron microscopy and, in particular, aberration correction in a scanning electron microscopy system.

BACKGROUND

The fabrication of semiconductor devices, such as logic and memory devices, typically includes processing a substrate such as a semiconductor wafer using a large number of semiconductor fabrication processes to form various features and multiple levels of the semiconductor devices. As semiconductor device size becomes smaller and smaller, it becomes critical to develop enhanced inspection and review devices and procedures.

One such inspection technology includes electron beam based inspection systems, such as, scanning electron microscopy (SEM). In one mode, SEM systems may image a surface of a sample through the collection and analysis of secondary electrons emitted from the surface of the sample as a primary beam is scanned across the sample. Typical SEM systems include a Wien filter located within the electron-optical column of the SEM and positioned above the sample for the purposes of deflecting the secondary electrons to a secondary electron detector.

The utilization of the Wien filter for splitting secondary electrons from the primary beam may cause chromatic aberration in the primary beam. Therefore, it would be advantageous to provide a system and method that provides correction for chromatic aberration in the primary beam and cures the shortcomings of the previous approaches identified above.

SUMMARY

A scanning electron microscopy (SEM) apparatus is disclosed, in accordance with one or more embodiments of the present disclosure. In one embodiment, the apparatus includes an electron beam source configured to generate a primary electron beam. In another embodiment, the apparatus includes a sample stage configured to secure a sample. In another embodiment, the apparatus includes a set of electron-optical elements configured to direct at least a portion of the primary electron beam onto a portion of the sample. In another embodiment, the set of electron-optical elements include a source lens disposed along an optical axis, a condenser lens disposed along the optical axis, and an objective lens disposed along the optical axis. In another embodiment, the set of electron-optical elements includes a first deflector assembly disposed along the optical axis, and a second deflector assembly disposed along the optical axis, the first deflector assembly and the second deflector assembly are disposed between the source lens and the objective lens, wherein the first deflector assembly is configured to correct chromatic aberration in the primary beam. In another embodiment, the apparatus includes a detector assembly configured to detect electrons emanating from the surface of the sample.

In one embodiment, the first deflector assembly and the second deflector assembly are Wien filters.

In another embodiment, the first deflector assembly and the second deflector assembly are disposed between the condenser lens and the objective lens.

In another embodiment, the first deflector assembly is disposed between the source lens and the condenser lens and the second deflector assembly is disposed between the condenser lens and the objective lens.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which:

FIGS. 1G and 1H illustrate simulations of chromatic aberrations in an electron beam caused by a Wien filter, in accordance with one or more embodiments of the present disclosure.

DETAILED DESCRIPTION OF THE INVENTION

Reference will now be made in detail to the subject matter disclosed, which is illustrated in the accompanying drawings. Referring generally to FIGS. 1A through 3, a system and method for performing scanning electron microscopy (SEM) imaging is described in accordance with the present disclosure.

Embodiments of the present disclosure are directed to an electron-optical system with dual deflector assemblies suitable for correcting chromatic aberration in the electron beam of the electron-optical system. In this regard, a first and second Wien filter placed in the electron-optical column of the electron-optical system may simultaneously cancel/correct chromatic aberration (i.e., electron energy dispersion aberration) in the primary electron beam and separate the secondary electron beam/cloud from the primary electron beam for collection by a secondary electron detector.

Figure 1A:
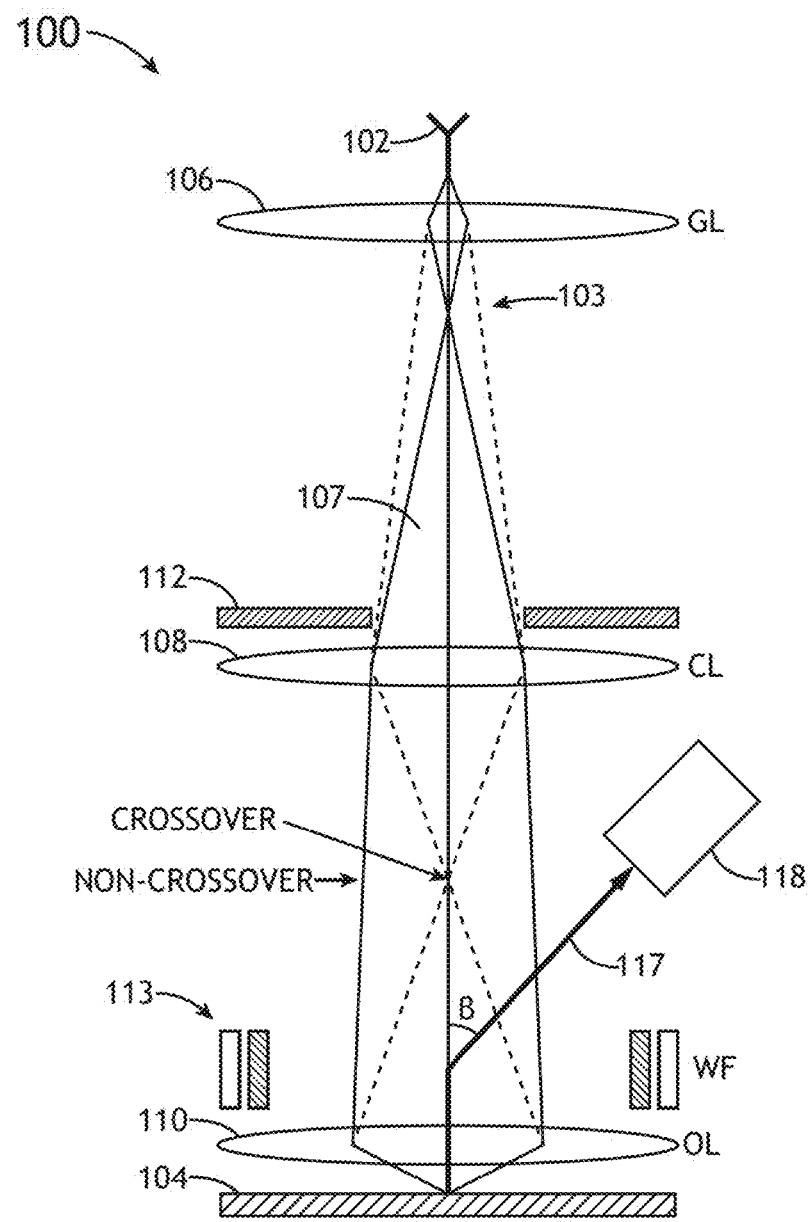
FIG. 1A illustrates a scanning electron microscopy system, in accordance with one or more embodiments of the present disclosure.

FIG. 1A illustrates a simplified schematic view of an electron-optical system 100 used for scanning electron microscopy/inspection/review of a sample 104, such as a semiconductor wafer. Such a system may include an electron emission source 102 (e.g., emission tip) and an electron-beam optical column. The electron emission source 102 may be characterized by the source brightness B and source energy spread ΔE. The electrons emitted from the source may be image-formed at the sample 104 by the lenses in the electron beam optical column. A complete electron beam optical column may include at least two lenses: the gun lens (GL) 106 and objective lens (OL) 110. The system may also include one or more condenser lenses (CL) 108. In the case where an aperture 112 is implemented to select the beam currents for various uses, one or more condenser lenses 108 is utilized, as shown in FIG. 1A. In this case, the aperture 112 may be positioned between gun lens 106 and the condenser lens 108. The gun lens 106 strength may be varied to select various beam currents via the aperture 112, and the condenser lens 108 strength may be varied to select an optimal numerical aperture at the sample 104. In the case where multi-apertures are utilized to select beam currents for various uses then only gun lens 106 and objective lens 110 are required to form a high quality image at the sample 104 because the multiple aperture sizes may be already designed to select the optimal NA. In addition, the primary electron beam 103 may be configured such that beam profile between the gun lens 106 and the condenser lens 108 is either in a cross-over or non-cross-over mode.

It is commonly necessary to split the secondary electron beam 117 from the primary electron beam 103 for forming an image of the sample 104 for SEM, review and/or inspection purposes. An EXB Wien filter (WF) or a magnetic deflector (MD) is commonly applied to do so.

The WF shown in FIG. 1A may be deployed close to the objective lens 110, such that the total column length may be reduced to limit the effects of Coulomb interactions between electrons. A side-detector 118 may be deployed to collect the secondary electrons 117, which are deflected by the Wien filter by an angle of β. The images for SEM, review and or inspection may be formed via the collected secondary electron signals.

Figure 1C:
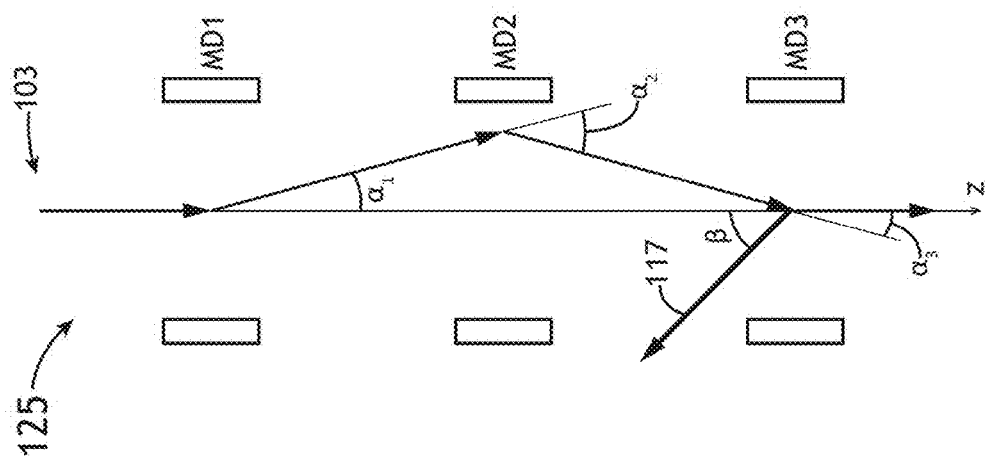
FIGS. 1B-1C illustrate the separation of secondary electrons from a primary beam in an electron-optical system using multiple magnetic deflectors, in accordance with one or more embodiments of the present disclosure.
Figure 1B:
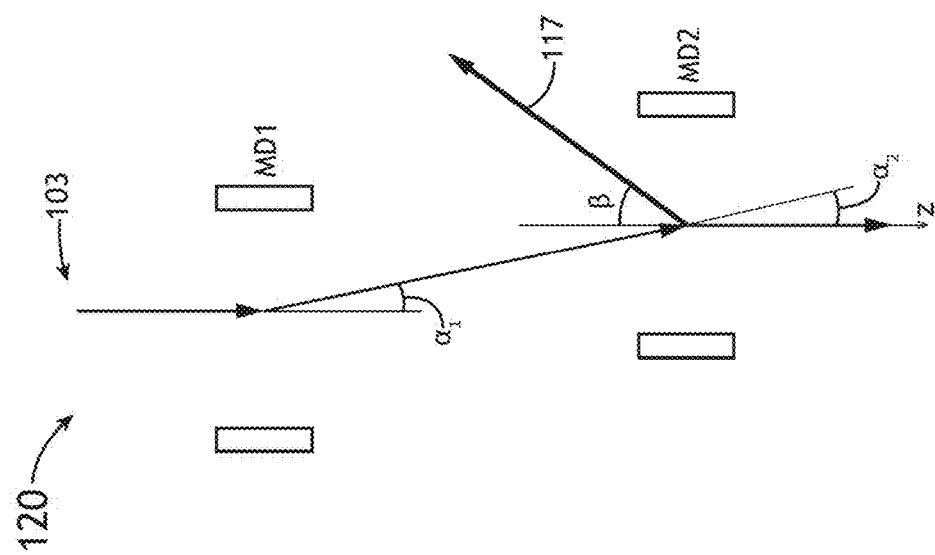

FIGS. 1B and 1C depict, respectively, the use of two and three magnetic deflectors (MD1, MD2 and MD3) to split secondary electrons 117 from the primary beam 103. As shown in the case of FIG. 1B, the optical axis may be shifted from an upper-stream to a lower-stream optical column. As shown in FIG. 1C, the electron-optical column may be kept straight. It is known that in a magnetic field the direction of the Lorentz force is dependent on the direction of motion of the electrons, so the secondary electrons 117 are split from the primary electrons 103 by one of the magnetic deflectors in FIGS. 1B-1C because their moving directions are opposite. It is noted that the angles $\alpha_1$, $\alpha_2$ and $\alpha_3$ represent the deflection angles associated with the magnetic deflectors MD1, MD2 and MD3, respectively. The splitting of a primary beam 103 from a secondary electron beam 117 using magnetic deflectors is described, for instance, in U.S. Pat. No. 6,452,175 to Pavel Adamec, filed on Apr. 15, 1999, which is incorporated herein by reference in the entirety.

It is noted that the presence of a Wien filter (without correction) for the purposes of splitting a secondary electron beam 117 from the primary beam 103 may cause a number of issues within the SEM system.

Figure 1D:
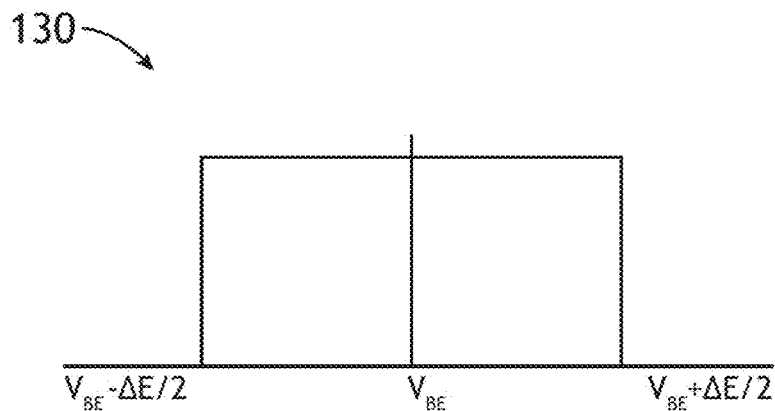
FIG. 1D illustrates the energy spread of an electron source in the case of an electron emitter, in accordance with one or more embodiments of the present disclosure.

First, the Wien filter may cause electron dispersion. The electron source 102 (e.g., Thermal-Field Emission source) may be characterized by brightness and energy spread. The source energy spread (ΔE), as shown in FIG. 1D, is the root cause of the generation of chromatic aberration and degrading resolution. Chromatic aberration may be divided into the lens chromatic aberration, Wien filter chromatic aberration and deflection chromatic aberration (i.e., transfer chromatic aberration). The lens and Wien filter chromatic aberrations impact the axial resolution, while the transfer chromatic aberration degrades the image uniformity across field of view (FOV).

Figure 1E:
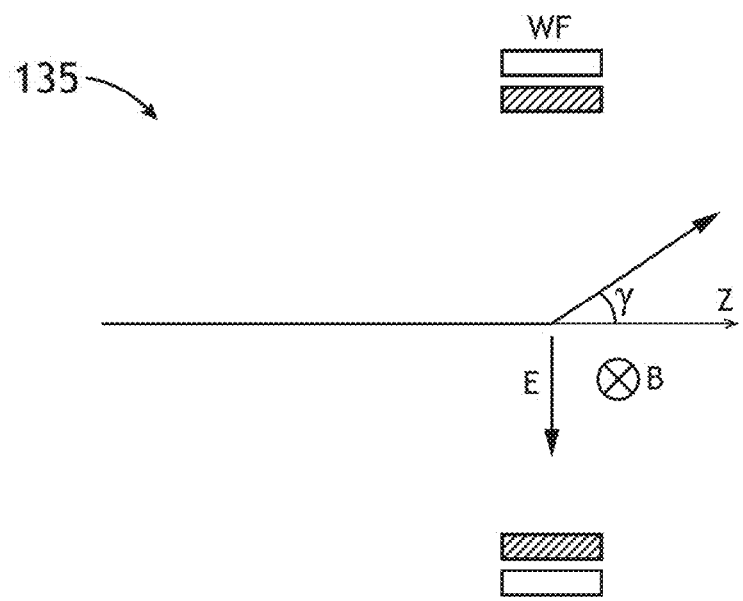
FIG. 1E illustrates electron energy dispersion resulting from a Wien filter in an electron optical column, in accordance with one or more embodiments of the present disclosure.

The electron energy dispersion is primarily generated due to different deflections of the electric field and magnetic field in a Wien filter. A Wien filter can only balance central energy (i.e., the beam energy (BE)) electrons, as shown in FIG. 1D. For the electrons with the energy variation from $V_{BE}-\Delta E/2$ to $V_{BE}+\Delta E/2$, the Wien filter generates an energy dispersion angle, γ, as shown in FIG. 1E. The dispersion angle is given by:

$$\gamma \propto \frac{E}{V_{BE}^2} * \Delta E \qquad \text{Eq. 1}$$

where E is the Wien filter electric field strength, and is balanced by the magnetic flux strength B for the electron with the central beam energy $V_{BE}$. The magnetic flux density B is given by:

$$B \propto E * \sqrt{\frac{m}{eV_{BE}}} \qquad \text{Eq. 2}$$

where m is the electron mass and e is the electron charge. The Wien filter energy dispersion angle γ only occurs in the balancing direction, i.e. the electric field E direction shown in FIG. 1D. In the perpendicular direction, i.e. the magnetic flux B direction, the Wien filter energy dispersion angle is zero.

Figure 1F:
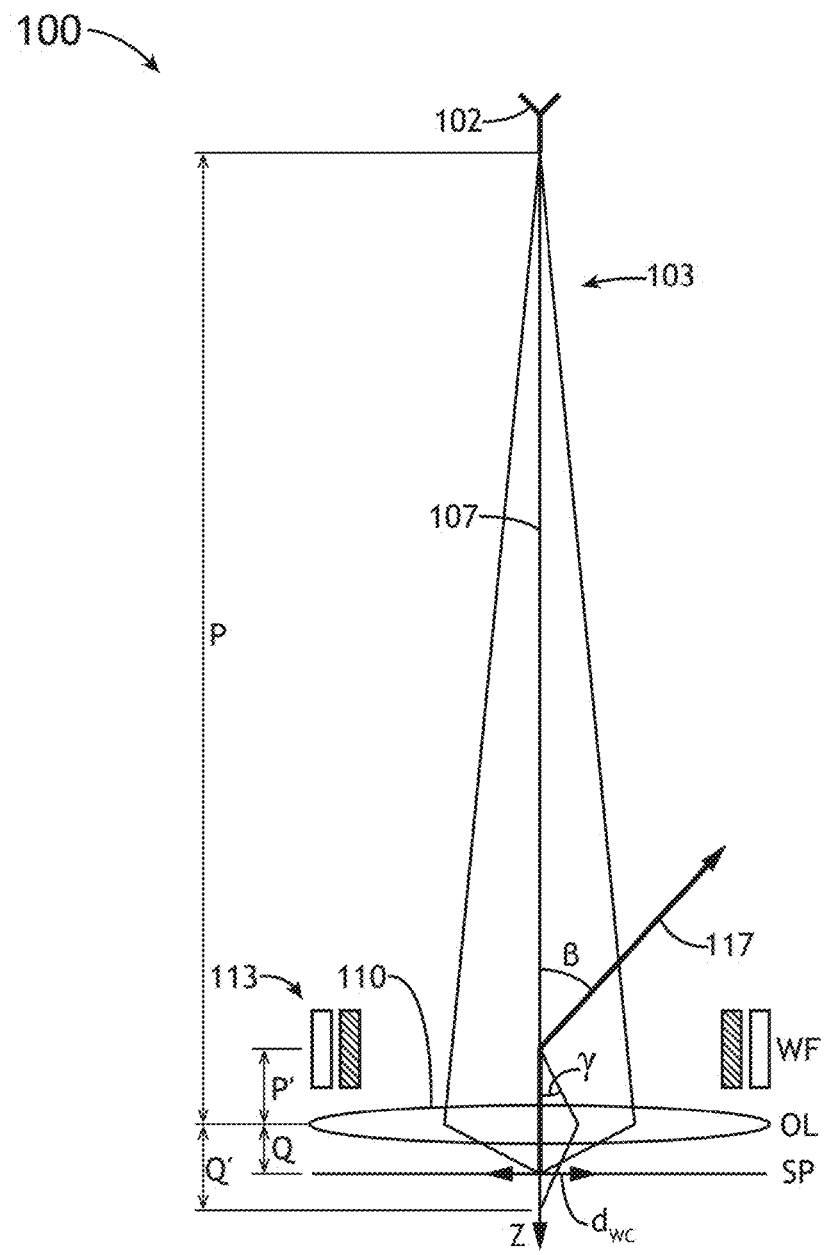
FIG. 1F illustrates chromatic aberration blur in a scanning electron microscopy system caused by energy dispersion by a Wien filter, in accordance with one or more embodiments of the present disclosure.

Second, the Wien filer may cause chromatic aberration in the primary beam of the electron-optical system. The energy dispersion angle γ at the Wien filter can be equivalent to a chromatic aberration blur at the sample ($d_{WC}$), as depicted in FIG. 1F. As shown in FIG. 1F, it is assumed that the objective lens 110 imaging relation is given by the object distance P and image distance Q. The Wien filter may be placed away from the objective lens 110 by a distance of P'. An energy-dispersed electron is defocused by the objective lens 110 since the distance P' is different from the distance P. The defocusing blur ($d_{WC}$ in FIG. 1F), is, accordingly, the chromatic blur induced by the Wien filter energy dispersion.

The Wien-filter-induced chromatic aberration blur can be expressed as:

$$d_{WC} \propto \sqrt{\frac{V_{BE}}{V_{LE}}} * C_c \gamma \qquad \text{Eq. 3}$$

where $V_{LE}$ is the electron landing energy voltage at the sample, and $C_c$ is chromatic aberration coefficient, given by:

$$C_C = P'Q\left(\frac{1}{P'} - \frac{1}{P}\right) \qquad \text{Eq. 4}$$

It is noted, according to Eq. 4, that as $C_c \rightarrow 0$ when $P \rightarrow P'$ or $C_c \rightarrow Q$ when $P \rightarrow \infty$. The primary electron beam is balanced by the Wien filter, while the secondary electron beam is deflected by an angle of β towards the side detector 118. Accordingly the Wien filter strength (EXB) is set properly. The Wien filter chromatic blur at the sample can be alternatively expressed as:

$$d_{WC} \propto \frac{\Delta E}{E_{\text{eff}}} * C_c \beta \qquad \text{Eq. 5}$$

where $E_{\text{eff}}$ is an effective beam energy given by:

$$E_{\text{eff}} = \sqrt{V_{BE} V_{LE}} \left(\frac{V_{BE}}{V_{BE} - V_{LE}} + \sqrt{\frac{V_{BE}}{V_{BE} - V_{LE}}}\right) \qquad \text{Eq. 6}$$

Eqs. 5 and 6 show that the Wien-filter-induced chromatic aberration is a function of source energy spread (ΔE), Wien filter position (P'), beam energy ($V_{BE}$), landing energy ($V_{LE}$), and detector position angle (β).

FIGS. 1G and 1H illustrate simulations demonstrating chromatic aberration in an electron beam caused by a Wien filter, in accordance with one or more embodiments of the present disclosure. It is noted that the simulations shown in FIGS. 1G and 1H comprise Monte Carlo simulations of Wien-filter-induced chromatic aberrations in an electron-optical system, such as that shown in FIG. 1A. FIG. 1G depicts the image-formed electron distributions of the primary electron beam 103 along the X- and Y-directions at the sample 104 when the Wien filter (WF) in FIG. 1A is OFF. FIG. 1H depicts the electron distributions along the X- and Y-directions at the sample 104 when the Wien filter is turned ON with sufficient strength to deflect the secondary electron beam 117 to the detector 118 with an angle of β. In the simulations FIG. 1H, the Wien filter balance is assumed in the X-direction. As shown from the results of the simulations, severe electron dispersions are observed in the X-direction. In the Y-direction, which does not experience fields from the Wien filter 113, the electrons are left un-dispersed.

It is further noted that the use of multiple magnetic deflectors may cause overly large defections in the primary electron beam. The deflection angle from a magnetic deflector in FIGS. 1B and 1C may be expressed as:

$$\alpha \propto \frac{B}{V_{BE}^{1/2}} \qquad \text{Eq. 7}$$

In which B is the magnetic flux density of a magnetic deflector, and $V_{BE}$ is the beam energy voltage. The energy dispersion angle of the magnetic deflector is accordingly given by:

$$\Delta\alpha = -\frac{\Delta E}{2V_{BE}} * \alpha \qquad \text{Eq. 8}$$

To make the total energy dispersion angle ($\Delta\alpha_{tot}$) of the multiple magnetic deflector system in FIGS. 1B and 1C sum to zero, the total net deflection of the magnetic deflectors should be zero, which is expressed as:

$$\Delta\alpha_{tot} = \sum_{i=1}^{n} \Delta\alpha_i = -\frac{\Delta E}{2V_{BE}} \sum_{i=1}^{n} \alpha_i = 0 \text{ if–only–if } \sum_{i=1}^{n} \alpha_i = 0 \qquad \text{Eq. 9}$$

where n is the number of the magnetic deflectors in the system of FIGS. 1B and 1C (e.g., n=2 in FIG. 1B and n=3 in FIG. 1C).

The use of magnetic deflectors suffers from several disadvantages. For example, the use of magnetic deflectors may require an over-deflection of the primary electron beam of the electron-optical system. For instance, limited in the number of practical designs, the side-detector 118 may be deployed such that the secondary electrons 117 must be deflected by a large angle β, meaning that the primary electron beam is required to be deflected an overly large angle α (e.g., $\alpha_2$ in FIG. 1B or $\alpha_3$ in FIG. 1C). If the deflection angle $\alpha_n$ (e.g., the final deflection angle) is required to be large, the rest of the deflection angles $\alpha_i$ (i=1, 2, . . . , n–1) must also be large. An overly large defection angle causes large off-axis aberrations (e.g., coma, astigmatism and field curvature) and distortion, requiring extra corrections for these off-axis effects.

The use of magnetic deflectors may require high strength magnetic deflectors. In a Wien filter system, the secondary electron deflection angle β in FIG. 1A is a summation of the electrostatic deflection and the magnetic deflection. As such, both deflector strengths can be much lower, compared to the magnetic-only deflection strength in FIGS. 1B-1C. Large strengths in a magnetic deflector may cause severe thermal and instable issues.

It is further noted that in the case where there exists a physical shift from the upper-stream optical column to lower-stream optical column (e.g., FIG. 1B), not only is an overly large deflection of the secondary electron beam 117 required, but optical alignment issues are unavoidable.

Figure 2A:
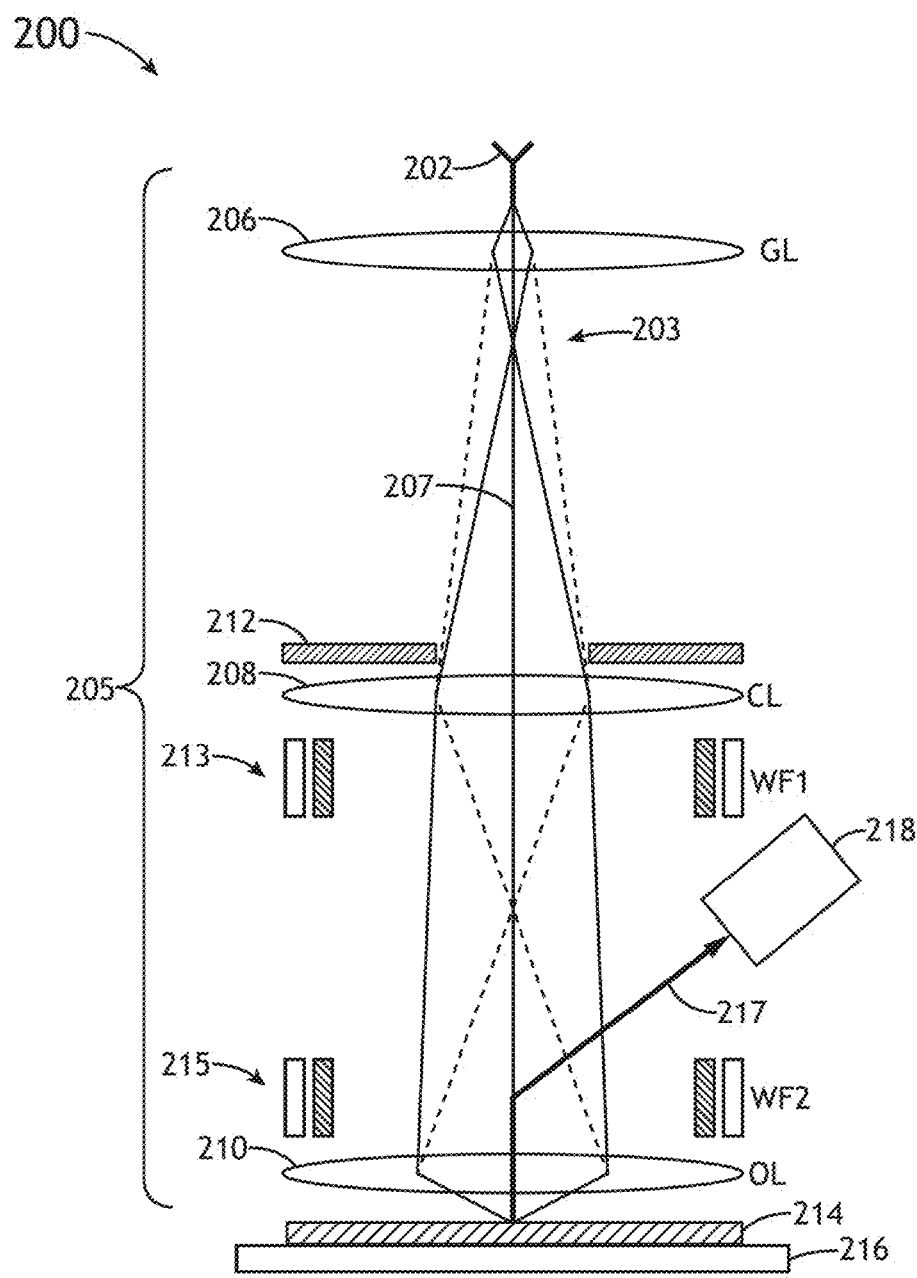
FIG. 2A illustrates an electron-optical system arranged for performing SEM imaging, in accordance with one or more embodiments of the present disclosure.

FIG. 2A illustrates system 200 arranged for performing SEM imaging, review and/or inspection, in accordance with one or more embodiments of the present disclosure. An electron-optical system is described in U.S. Patent Publication No. 2016/0329189, filed on May 6, 2016, which is incorporated herein by reference in the entirety.

In one embodiment, the system 200 includes an electron beam source 202 for generating one or more electron beams 203. The electron beam source 202 may include any electron source known in the art. For example, the electron beam source 202 may include, but is not limited to, one or more electron guns (e.g., emitter/emission tip). For instance, the electron beam source 202 may include a single electron gun for generating a single electron beam 203. In another instance, the electron beam source 202 may include multiple electron guns for generating multiple electron beams 203. In another instance, the electron beam source 202 may include a single electron gun and an aperture plate including multiple apertures for splitting a single electron beam into multiple electron beams 203 A multiple-beam electron-optical system is described in U.S. patent application Ser. No. 15/267,223, filed on Sep. 16, 2016, which is incorporated herein by reference in the entirety.

In another embodiment, the system 200 includes a sample stage 216. The sample stage 216 secures the sample 214. The sample 214 may include any sample suitable for inspection/review with electron-beam microscopy, such as, but not limited to, a substrate. The substrate may include, but is not limited to, a silicon wafer. In another embodiment, the sample stage 216 is an actuatable stage. For example, the sample stage 216 may include, but is not limited to, one or more translational stages suitable for selectably translating the sample 214 along one or more linear directions (e.g., x-direction, y-direction and/or z-direction). By way of another example, the sample stage 216 may include, but is not limited to, one or more rotational stages suitable for selectively rotating the sample 214 along a rotational direction. By way of another example, the sample stage 216 may include, but is not limited to, a rotational stage and a translational stage suitable for selectably translating the sample along a linear direction and/or rotating the sample 214 along a rotational direction. It is noted herein that the system 200 may operate in any scanning mode known in the art. For example, the system 200 may operate in a swathing mode when scanning the primary electron beam 203 across the surface of the sample 214. In this regard, the system 200 may scan the primary electron beam 203 across the sample 214, while the sample is moving, with the direction of scanning being nominally perpendicular to the direction of the sample motion. By way of another example, the system 200 may operate in a step-and-scan mode when scanning the primary electron beam 203 across the surface of the sample 214. In this regard, the system 200 may scan the primary electron beam 203 across the sample 214, which is nominally stationary when the beam 203 is being scanned.

In another embodiment, the system 200 includes a detector assembly 218. For example, the detector assembly 218 may be a secondary electron detector. It is noted that that the detector assembly 218 may include any type of electron detector known in the art. In one embodiment, the detector assembly 218 may include a scintillator-based detector for collecting secondary electrons from the sample 214, such as, but not limited to, an Everhart-Thornley detector. In another embodiment, the detector assembly 218 may include a micro-channel plate (MCP) for collecting secondary electrons from the sample 214. In another embodiment, the detector assembly 218 may include a PIN or p-n junction detector, such as a diode or a diode array, for collecting secondary electrons from the sample 214. In another embodiment, the detector assembly 218 may include one or more avalanche photo diodes (APDs) for collecting secondary electrons from the sample 214.

In another embodiment, the system 200 includes a set of electron-optical elements 205. The set of electron-optical elements 205 may form an electron-optical column defined by an optical axis 207 (e.g., z-axis) as shown in FIG. 2A. For purposes of simplicity, a single electron-optical column is depicted in FIG. 2A. It is noted herein that this configuration should not be interpreted as a limitation on the scope of present disclosure. For example, the system 200 may include multiple electron-optical columns.

The set of electron-optical elements 205 may direct at least a portion of the primary electron beam 203 onto a selected portion of the sample 214. The set of electron-optical elements may include any electron-optical elements known in the art suitable for focusing and/or directing the primary electron beam 203 onto a selected portion of the sample 214.

The set of electron-optical elements 205 may include one or more electron-optical lenses. In one embodiment, the set of electron-optical elements 205 includes a source lens 206, or a guns lens (GL), disposed along the optical axis 207. In another embodiment, the set of electron-optical elements 205 includes a condenser lens (CL) 208 disposed along the optical axis 207. In another embodiment, the set of electron-optical elements 205 includes an objective lens (OL) 210 disposed along the optical axis 207.

In another embodiment, the system 200 includes an aperture 212. The aperture may be used to select the beam currents of the system 200 for various uses. In this embodiment, the aperture 212 may be positioned between the gun lens 206 and the condenser lens 208. The strength of the gun lens 206 may be varied to select various beam currents via the aperture 212, and the strength of the condenser lens 208 may be varied to select an optimal numerical aperture (NA) at the sample so as to form an image that has adequate quality and resolution. In cases where multiple apertures are used to select the beam current of the system 200, only the gun lens 206 and objective lens 210 are required to form the image at the sample 214 because the multiple aperture sizes may already be designed to select the optimal NA.

The system 200 may include a first deflector assembly 213 and a second deflector assembly 215. For example, the first deflector assembly 213 and the second deflect assembly 215 may each be Wien filters. For the purposes of the present disclosure, the first deflector assembly 213 will be referred to as the first Wien filter 213 (WF1) and the second deflector assembly 215 will be referred to as the second Wien filter 215 (WF2).

In one embodiment, the first Wien filer 213 is configured to correct chromatic aberration in the primary beam 203. For example, the first Wien filter 213 may correct chromatic aberration in the primary beam 203 caused by the first Wien filter 213 and/or the second Wien filter 215. The conditions for this correction are discussed in further detail below.

In another embodiment, the second Wien filter 215 is configured to direct the secondary electrons (SE) emitted by the sample 214 (in response to the primary beam 203) to the detector assembly 218. In this regard, the system 200 may correct for chromatic aberration in the primary electron beam 203, while simultaneously splitting the secondary electrons 217 from the beam of primary electrons 203 for collection by the detector assembly 218.

It is noted that the first Wien filter 213 and the second Wien filter 215 may be placed at any position along the optical axis 207 and achieve total cancellation of the Wien filter chromatic aberrations of system 200. For example, the first Wien filter 213 and the second Wien filter 215 may both be disposed between the gun lens 206 and the objective lens 210.

As depicted in FIG. 2A, in one embodiment, the first Wien filter 213 and the second Wien filter 215 are both disposed between the condenser lens 208 and the objective lens 210. In this embodiment, the second Wien filter 215 may be placed in close proximity to the objective lens 210 in order to detect the secondary electrons 217 towards the deflector assembly 218 for collection. The first Wien filter 213 may be placed below the condenser lens 208 and is used to correct the total chromatic aberrations in the primary beam 203 caused by the first Wien filter 213 and the second Wien filter 215.

As shown in FIG. 2A, the primary beam 203 may take on a cross-over beam profile (dotted line) or a non-cross-over beam profile (solid line). In this regard, the primary beam 203 may be telecentric or non-telecentric (e.g., divergent or convergent).

FIGS. 2B-2E illustrate the operation of system 200 in various beam configurations, in accordance with one or more embodiments of the present disclosure.

It is noted that the second Wien filter 215 is assumed to deflect the secondary electrons 217 to the detector assembly 218 at an angle β (although not shown in FIGS. 2B-2E). The first Wein filter 213 serves to correct the total Wien-filter-induced chromatic aberrations from the first Wein filter 213 and/or the second Wien filter 215 at the sample 214. The conditions for cancelling the chromatic aberrations are given by:

$$C_{c1}\gamma_1 + C_{c2}\gamma_2 = 0 \qquad \text{Eq. 10a}$$

or $$\gamma_1 = -\frac{C_{c2}}{C_{c1}}\gamma_2 \qquad \text{Eq. 10b}$$

where $$C_{c1} = P_1'Q\left(\frac{1}{P_1'} - \frac{1}{P}\right) \qquad \text{Eq. 11}$$

$$C_{c2} = P_2'Q\left(\frac{1}{P_2'} - \frac{1}{P}\right) \qquad \text{Eq. 12}$$

The cancellation condition of the chromatic aberration in Eq. 10a and Eq. 10b is illustrated in FIGS. 2B-2E, in which the pre-dispersed electron beam 203 with the dispersion angle $\gamma_1$ in the first Wien filter 213 is moved to compensate the dispersion angle $\gamma_2$ in the second Wien filter 215, such that the electron beam is equivalent that which would be emitted from the object of the objective lens 210.

It is noted that the strengths of the first Wein filter 213 (E1/B1) and the second Wien filter 215 (E2/B2) may be provided by Eq. 1 and Eq. 2 (described previously herein) with the dispersion angles $\gamma_1$ and $\gamma_2$. E2/B2 may first be provided by meeting the secondary electron deflection angle, β, and then the second dispersion angle ($\gamma_2$) and the first dispersion angle ($\gamma_1$) may be defined.

It is noted that the cancellation procedure noted in Eq. 10a and Eq. 10b is universal and may be extended to electron beam having either a i) cross-over profile; or ii) non-cross-over profile, such as divergent, telecentric or convergent beams, in between the condenser lens 208 and objective lens 210, as shown in FIG. 2A.

Figure 2B:
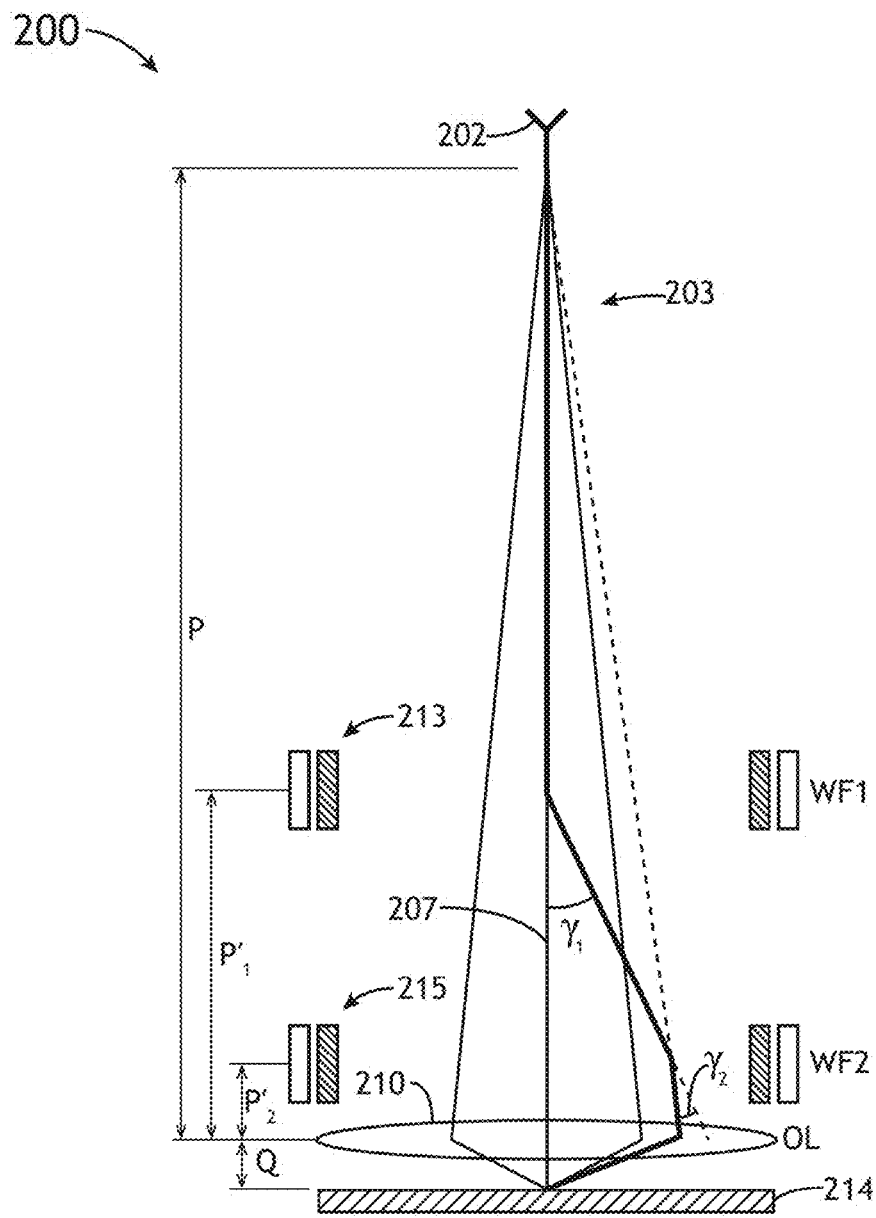
FIG. 2B illustrates the operation of an electron-optical system in the case of a divergent beam profile, in accordance with one or more embodiments of the present disclosure

FIG. 2B illustrates the operation of system 200 in the case of a divergent beam profile, in accordance with one or more embodiments of the present disclosure. In this embodiment, the divergent beam 203 illuminates the objective lens 210. Here, if $P > P'_1 > P'_2$ then $C_{c2} > C_{c1} > 0$ in Eqs. 10a, 10b, 11 and 12. In this case, the strength of the first Wien filter 213 should be larger than the strength of the second Wien filter 215 and the polarity of the first Wien filter 213 should be reversed relative to the polarity of the second Wien filter 215 to completely correct the chromatic blurs created by the first Wien filter 213 and/or the second Wien filter 215.

Figure 2C:
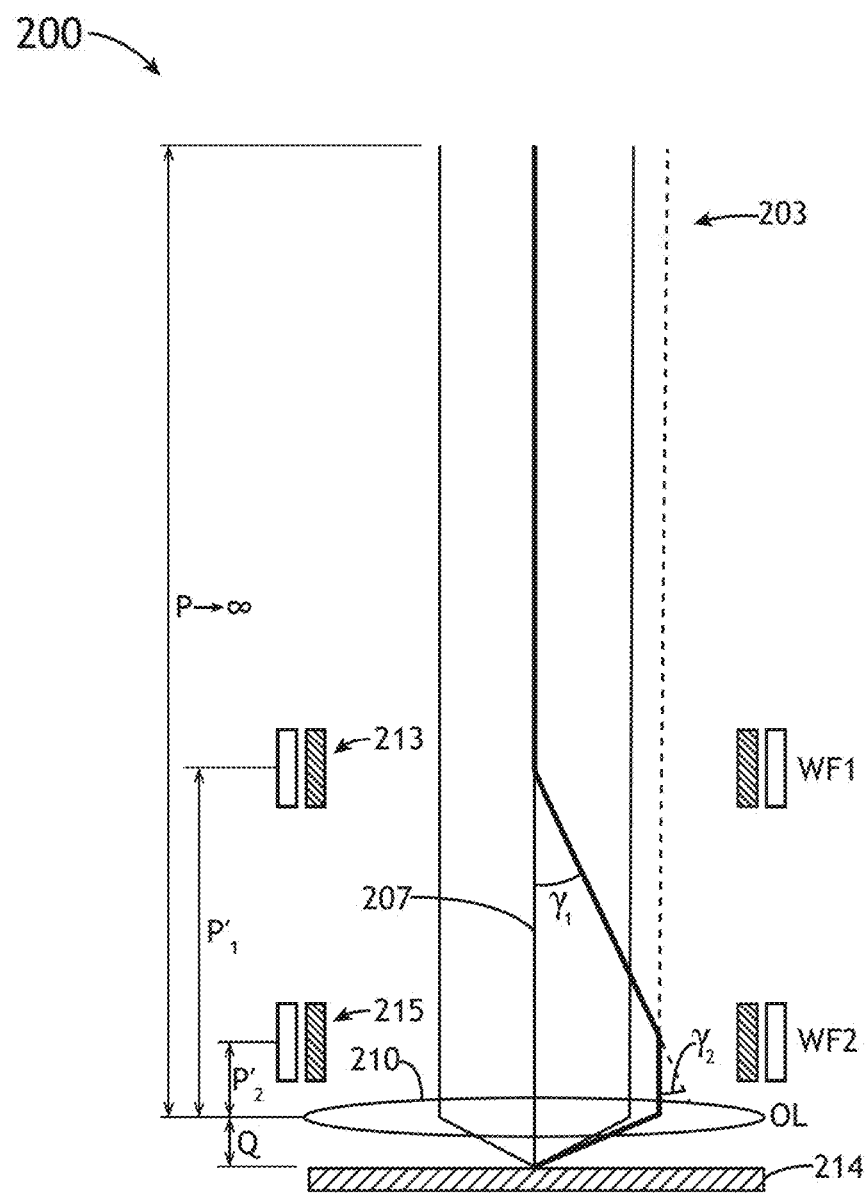
FIG. 2C illustrates the operation of an electron-optical system in the case of a telecentric beam profile, in accordance with one or more embodiments of the present disclosure.

FIG. 2C illustrates the operation of system 200 in the case of a telecentric beam profile, in accordance with one or more embodiments of the present disclosure. In this embodiment, the telecentric beam 203 illuminates the objective lens 210. Here, if P→infinity then $C_{c2} = C_{c1} = Q > 0$ in Eqs. 10a, 10b, 11 and 12. In this case, the strength of the first Wien filter 213 may be equal to strength of the second Wien filter 215, with the polarity of the first Wien filter 213 reversed relative to the polarity of the second Wien filter 215 to completely correct the chromatic blurs created by the first Wien filter 213 and/or the second Wien filter 215.

Figure 2D:
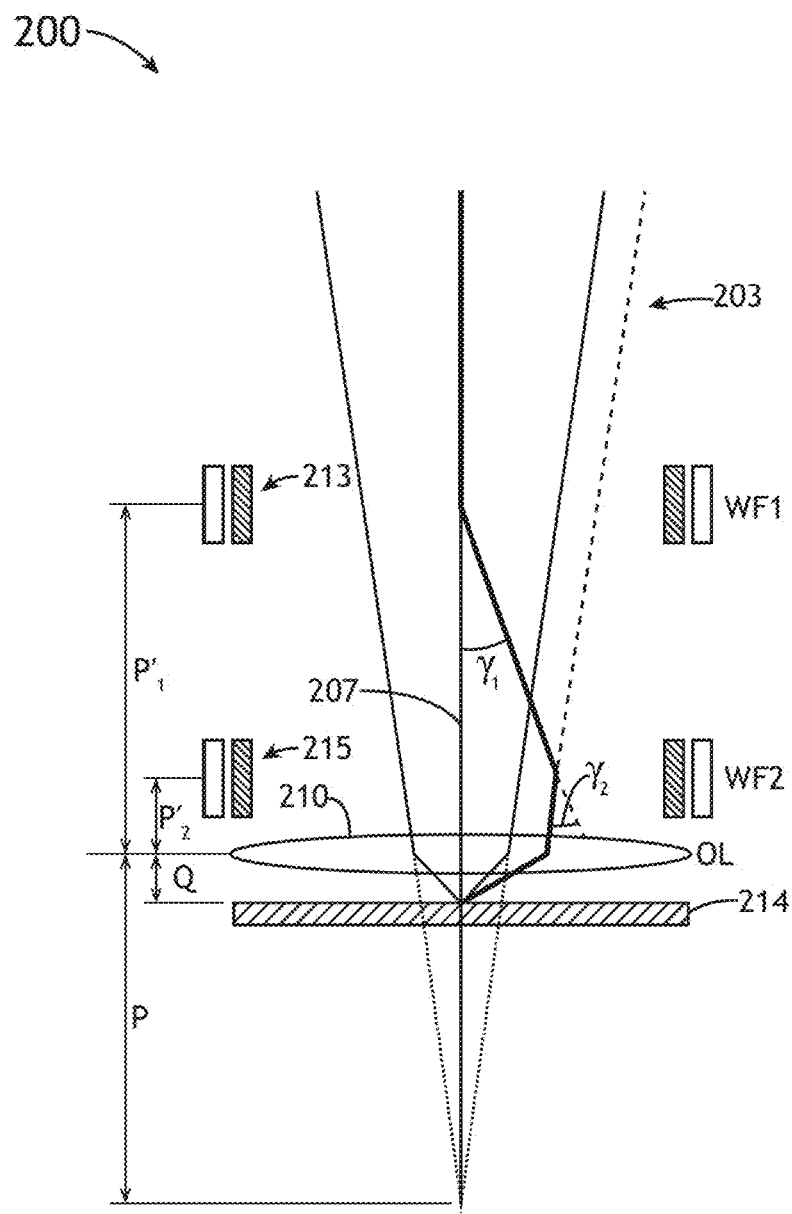
FIG. 2D illustrates the operation of an electron-optical system in the case of a convergent beam profile, in accordance with one or more embodiments of the present disclosure.

FIG. 2D illustrates the operation of system 200 in the case of a convergent beam profile, in accordance with one or more embodiments of the present disclosure. In this embodiment, the convergent beam 203 illuminates the objective lens 210. Here, if $P'_1 > P'_2$ and $P < 0$ then $C_{c1} > C_{c2} > 0$ in Eqs. 10a, 10b, 11 and 12. In this case, the strength of the first Wien filter 213 should be smaller than the strength of the second Wien filter 215 and the polarity of the first Wien filter 213 should be reversed relative to the polarity of the second Wien filter 215 to completely correct the chromatic blurs created by the first Wien filter 213 and/or the second Wien filter 215.

Figure 2E:
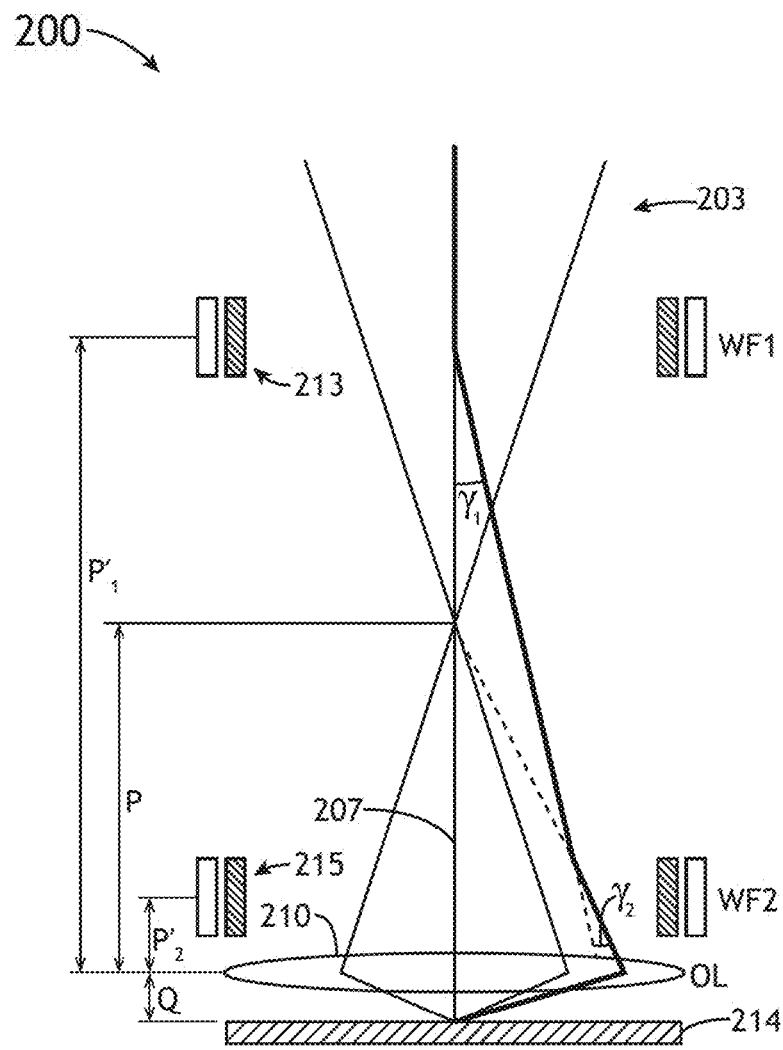
FIG. 2E illustrates the operation of an electron-optical system in the case of a cross-over beam profile, in accordance with one or more embodiments of the present disclosure.

FIG. 2E illustrates the operation of system 200 in the case of a cross-over beam profile, in accordance with one or more embodiments of the present disclosure. In this embodiment, the cross-over beam 203 illuminates the objective lens 210. Here, if $P'_1 > P > P'_2$ then $C_{c1} < 0$ and $C_{c2} > 0$ in Eqs. 10a, 10b, 11 and 12. In this case, the strength of the first Wien filter 213 can be larger or smaller than the strength of the second Wien filter 215 (based on the cross-over position of the beam 203 with respect to the positions of the Wien filters 213, 215) to completely correct the chromatic blurs created by the first Wien filter 213 and/or the second Wien filter 215. In one embodiment, the polarity of the first Wien filter 213 may be set so that it is the same as to the polarity of the second Wien filter 215 according to Eq. 10b (with the fact of $C_{c1} < 0$ and $C_{c2} > 0$).

Figure 2F:
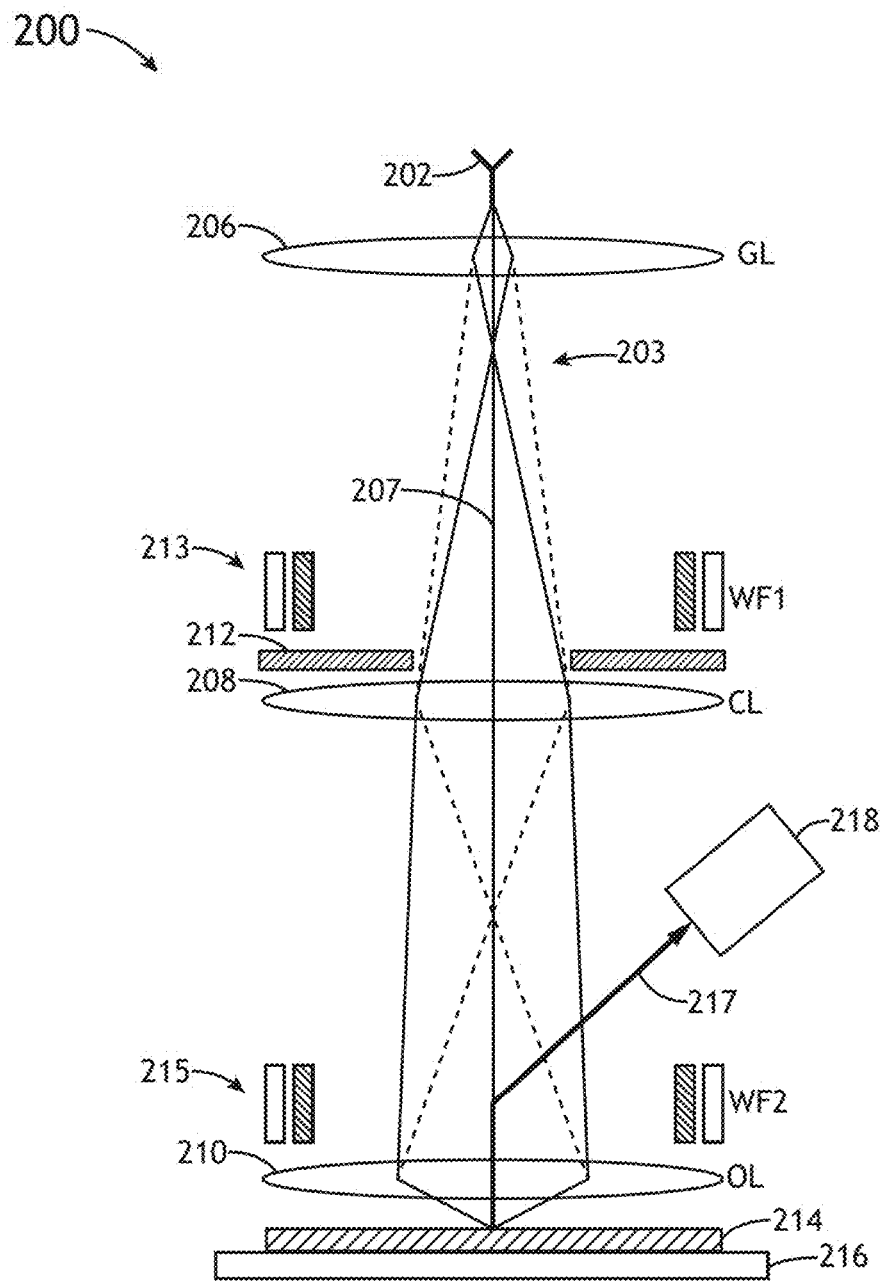
FIG. 2F illustrates an electron-optical system arranged for performing SEM imaging, in accordance with one or more alternative embodiments of the present disclosure.

It is noted that while much of the present disclosure has focused on the implementation of system 200 with both the first Wien filter 213 and the second Wien filter 215 positioned between the condenser lens 208 and the objective lens 210, such a configuration is not a limitation on the scope of the present disclosure. Rather, it is noted herein that the first Wien filter 213 may generally be placed at any position along the optical axis 207, provided that the proper coefficient $C_{c1}$ (from equations above) is applied according to the image-forming configuration in the electron-optical system 200. FIG. 2F illustrates system 200 arranged for performing SEM imaging, in accordance with one or more alternative embodiments of the present disclosure. In this embodiment, the first Wien filter 213 is placed between the gun lens 206 and the condenser lens 208.

Figure 3:
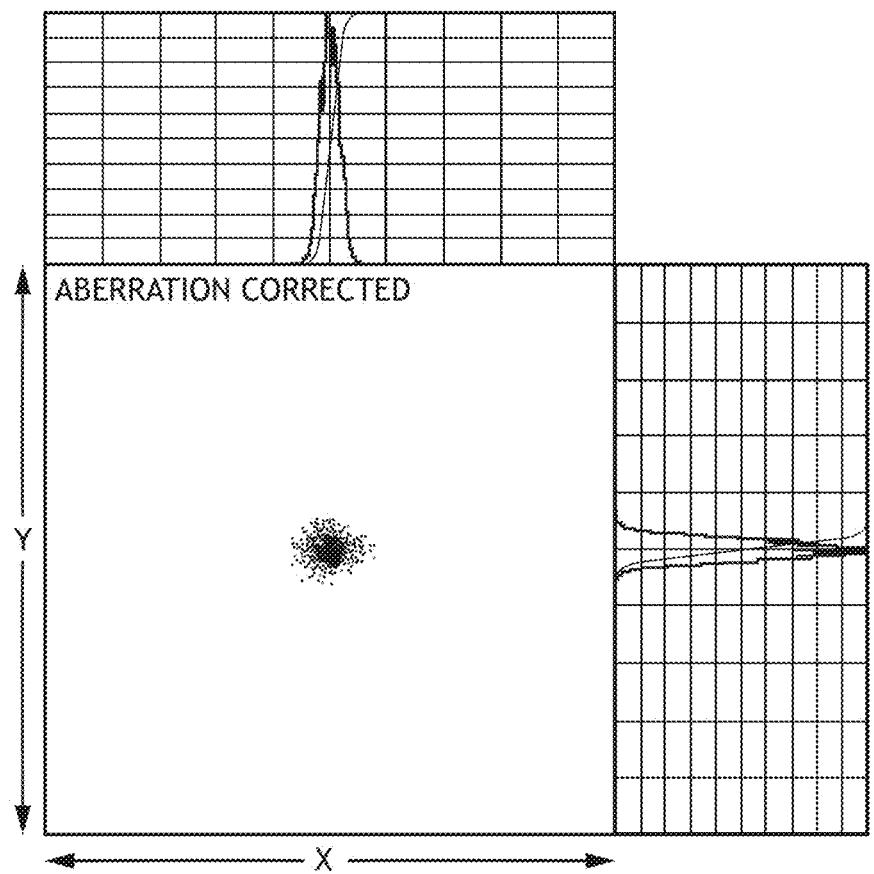
FIG. 3 illustrates a simulation of an electron distribution following correction of chromatic aberrations caused by one or more Wien filters, in accordance with one or more embodiments of the present disclosure.

FIG. 3 illustrates a graph 300 of a simulation of an electron distribution following correction of chromatic aberrations caused by one or more Wien filters, in accordance with one or more embodiments of the present disclosure. It is noted that the electron distributions of graph 300 were simulated based on an electron-optical configuration consistent with the electron-optical configuration depicted in FIG. 2B. Further, the electron-optical cancellation conditions of Eqs. 10a and 10b were established. As shown in graph 300, the establishment of the cancellation conditions leads to complete correction of the Wien filter chromatic aberrations. This is highlighted by comparing graph 300 of FIG. 3 to graphs 140 and 145 of FIGS. 1G and 1H, which are plotted on the same scale as graph 300. It is noted that the spot size produced by the electron distributions after chromatic correction (shown in graph 300 of FIG. 3) resembles that in graph 140 of FIG. 1G, which corresponds to an electron distribution in the case of no chromatic aberration caused by a Wien filter. In this sense, the electron dispersion along the x-axis (the Wien filter balancing direction), which appears in the graph 145 of FIG. 1H, is completely removed in FIG. 3 by the implementation of the canceling conditions via the first Wien filter 213.

All of the methods described herein may include storing results of one or more steps of the method embodiments in a storage medium. The results may include any of the results described herein and may be stored in any manner known in the art. The storage medium may include any storage medium described herein or any other suitable storage medium known in the art. After the results have been stored, the results can be accessed in the storage medium and used by any of the method or system embodiments described herein, formatted for display to a user, used by another software module, method, or system, etc. Furthermore, the results may be stored "permanently," "semi-permanently," temporarily, or for some period of time. For example, the storage medium may be random access memory (RAM), and the results may not necessarily persist indefinitely in the storage medium.

Those having skill in the art will recognize that the state of the art has progressed to the point where there is little distinction left between hardware and software implementations of aspects of systems; the use of hardware or software is generally (but not always, in that in certain contexts the choice between hardware and software can become significant) a design choice representing cost vs. efficiency tradeoffs. Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations will typically employ optically-oriented hardware, software, and or firmware.

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes.

What is claimed:

1. An electron-optical system comprising:
   an electron beam source configured to generate a primary electron beam;
   a sample stage configured to secure a sample;
   a set of electron-optical elements configured to direct at least a portion of the primary electron beam onto a portion of the sample, the set of electron-optical elements comprising:
   a source lens disposed along an optical axis;
   a condenser lens disposed along the optical axis;
   an objective lens disposed along the optical axis;
   a first deflector assembly disposed along the optical axis; and
   a second deflector assembly disposed along the optical axis, the first deflector assembly and the second deflector assembly are disposed between the source lens and the objective lens, wherein the first deflector assembly is configured to correct chromatic aberration in the primary beam, wherein at least one of the first deflector assembly or the second deflector assembly comprises a Wien filter; and
   a detector assembly configured to detect electrons emanating from the surface of the sample.

2. The apparatus of claim 1, wherein the first deflector assembly and the second deflector assembly are disposed between the condenser lens and the objective lens.

3. The apparatus of claim 1, wherein the first deflector assembly is disposed between the source lens and the condenser lens and the second deflector assembly is disposed between the condenser lens and the objective lens.

4. The apparatus of claim 1, wherein the first deflector assembly is configured to correct chromatic aberration in the primary beam caused by one or more portions of the set of electron-optical elements.

5. The apparatus of claim 1, wherein the second deflector assembly is configured to direct electrons emanating from the sample to the detector assembly.

6. The apparatus of claim 5, wherein the second deflector assembly is configured to direct secondary electrons emanating from the sample to the detector assembly.

7. The apparatus of claim 1, wherein the primary electron beam comprises:
a telecentric electron beam.

8. The apparatus of claim 7, wherein the strength of the first deflector assembly is equal to the strength of the second deflector assembly.

9. The apparatus of claim 8, wherein the polarity of the first deflector assembly is reversed relative to the polarity of the second deflector assembly.

10. The apparatus of claim 1, wherein the primary electron beam comprises:
a divergent electron beam.

11. The apparatus of claim 10, wherein the strength of the first deflector assembly is larger than the strength of the second deflector assembly.

12. The apparatus of claim 11, wherein the polarity of the first deflector assembly is reversed relative to the polarity of the second deflector assembly.

13. The apparatus of claim 1, wherein the primary electron beam comprises:
a convergent electron beam.

14. The apparatus of claim 13, wherein the strength of the first deflector assembly is smaller than the strength of the second deflector assembly.

15. The apparatus of claim 14, wherein the polarity of the first deflector assembly is reversed relative to the polarity of the second deflector assembly.

16. The apparatus of claim 1, wherein the primary electron beam comprises:
a cross-over electron beam.

17. The apparatus of claim 16, wherein the polarity of the first deflector assembly is the same as the polarity of the second deflector assembly.

18. The apparatus of claim 17, wherein the strength of the first deflector assembly is equal to the strength of the second deflector assembly.

19. The apparatus of claim 17, wherein the strength of the first deflector assembly is larger than the strength of the second deflector assembly.

20. The apparatus of claim 17, wherein the strength of the first deflector assembly is smaller than the strength of the second deflector assembly.

21. The apparatus of claim 1, wherein the electron beam source comprises:
one or more electron guns.

22. The apparatus of claim 1, wherein the detector assembly comprises:
one or more secondary electron detectors.

23. An electron-optical system comprising:
an electron beam source configured to generate a primary electron beam;
a source lens disposed along an optical axis;
a condenser lens disposed along the optical axis;
an objective lens disposed along the optical axis;
a first Wien filter disposed along the optical axis;
a second Wien filter disposed along the optical axis, the first Wien filter and the second Wien filter are disposed between the source lens and the objective lens, wherein the first Wien filter is configured to correct chromatic aberration in the primary beam; and
a detector assembly configured to detect electrons emanating from the surface of the sample.

24. The apparatus of claim 23, wherein the first Wien filter and the second Wien filter are disposed between the condenser lens and the objective lens.

25. The apparatus of claim 23, wherein the first Wien filter is disposed between the source lens and the condenser lens and the second Wien filter is disposed between the condenser lens and the objective lens.

26. The apparatus of claim 23, wherein the first Wien filter is configured to correct chromatic aberration in the primary beam caused by one or more portions of the set of electron-optical elements.

27. The apparatus of claim 23, wherein the second Wien filter is configured to direct secondary electrons emanating from the sample to a detector assembly.

28. The apparatus of claim 23, wherein the primary electron beam comprises:
a telecentric electron beam.

29. The apparatus of claim 28, wherein the strength of the first Wien filter is equal to the strength of the second Wien filter.

30. The apparatus of claim 29, wherein the polarity of the first Wien filter is reversed relative to the polarity of the second Wien filter.

31. The apparatus of claim 23, wherein the primary electron beam comprises:
a divergent electron beam.

32. The apparatus of claim 31, wherein the strength of the first Wien filter is larger than the strength of the second Wien filter.

33. The apparatus of claim 32, wherein the polarity of the first Wien filter is reversed relative to the polarity of the second Wien filter.

34. The apparatus of claim 23, wherein the primary electron beam comprises:
a convergent electron beam.

35. The apparatus of claim 34, wherein the strength of the first Wien filter is smaller than the strength of the second Wien filter.

36. The apparatus of claim 35, wherein the polarity of the first Wien filter is reversed relative to the polarity of the second Wien filter.

37. The apparatus of claim 23, wherein the primary electron beam comprises:
a cross-over electron beam.

38. The apparatus of claim 37, wherein the polarity of the first deflector assembly is the same as the polarity of the second deflector assembly.

39. The apparatus of claim 38, wherein the strength of the first Wien filter is equal to the strength of the second Wien filter.

40. The apparatus of claim 38, wherein the strength of the first Wien filter is larger than the strength of the second Wien filter.

41. The apparatus of claim 38, wherein the strength of the first Wien filter is smaller than the strength of the second Wien filter.

42. The apparatus of claim 23, wherein the electron beam source comprises:
one or more electron guns.

43. The apparatus of claim 23, wherein the detector assembly comprises:
one or more secondary electron detectors.

44. The apparatus of claim 23, wherein the electron-optical system is a scanning electron microscopy (SEM) system.

* * * * *